United States Patent [19]

Lofgren et al.

[11] Patent Number: 4,922,141

[45] Date of Patent: May 1, 1990

[54] PHASE-LOCKED LOOP DELAY LINE

[75] Inventors: Karl M. J. Lofgren, Long Beach; Gerald W. Shearer, Orange; Kenneth W. Ouyang, Huntington Beach, all of Calif.

[73] Assignee: Western Digital Corporation, Calif.

[21] Appl. No.: 205,517

[22] Filed: Jun. 3, 1988

Related U.S. Application Data

[63] Continuation of Ser. No. 916,404, Oct. 7, 1986.

[51] Int. Cl.⁵ .................. H03K 5/159; H03K 3/01
[52] U.S. Cl. ...................... 307/595; 307/511; 307/597; 307/602; 307/603; 328/55; 328/155
[58] Field of Search ............ 307/590, 591, 594, 595, 307/597, 602, 603, 605, 606, 511, 525, 358, 359; 328/155, 55, 66

[56] References Cited

U.S. PATENT DOCUMENTS

| | | | |
|---|---|---|---|
| 3,206,686 | 9/1965 | Goor | 328/155 |
| 4,277,754 | 7/1981 | Minakuchi | 307/525 |
| 4,473,752 | 9/1984 | Iwahashi et al. | 307/591 |
| 4,494,021 | 1/1985 | Bell et al. | 307/481 |
| 4,495,468 | 1/1985 | Richards et al. | 328/155 |
| 4,504,749 | 3/1985 | Yoshida | 307/603 |
| 4,639,680 | 1/1987 | Nelson | 328/155 |
| 4,641,048 | 2/1987 | Pollock | 307/595 |
| 4,652,778 | 3/1987 | Hosoya et al. | 307/605 |
| 4,710,653 | 12/1987 | Yee | 307/602 |
| 4,737,670 | 4/1988 | Chan | 307/603 |

FOREIGN PATENT DOCUMENTS

| | | |
|---|---|---|
| 0139126 | 2/1985 | European Pat. Off. |
| 2645638 | 5/1977 | Fed. Rep. of Germany |
| 1516699 | 9/1975 | United Kingdom |
| 2129634 | 5/1984 | United Kingdom |
| 2130825 | 6/1984 | United Kingdom |
| 0138276 | 4/1985 | United Kingdom |
| 2110893 | 10/1985 | United Kingdom |

OTHER PUBLICATIONS

1988 IEEE International Solid-State Circuits Conference, Session XI: High Speed Logic, Mark G. Johnson, Edwin L. Hudson, p. 142.

*Primary Examiner*—Stanley D. Miller
*Assistant Examiner*—Trong Quang Phan
*Attorney, Agent, or Firm*—Horn Jubas & Lubitz Spensley

[57] ABSTRACT

A circuit for providing precise delays includes a phase-locked loop driven by a reference frequency source such as a crystal oscillator and including a variable delay circuit. The output of the oscillator is applied to the delay circuit and the non-delayed and delayed signals are compared in a phase comparator. An error signal representative of phase error is developed and applied to vary the amount of delay until the phase error is eliminated. A precise delay referenced to the oscillator frequency is therefore achieved.

31 Claims, 5 Drawing Sheets

U.S. Patent   May 1, 1990   Sheet 1 of 5   4,922,141
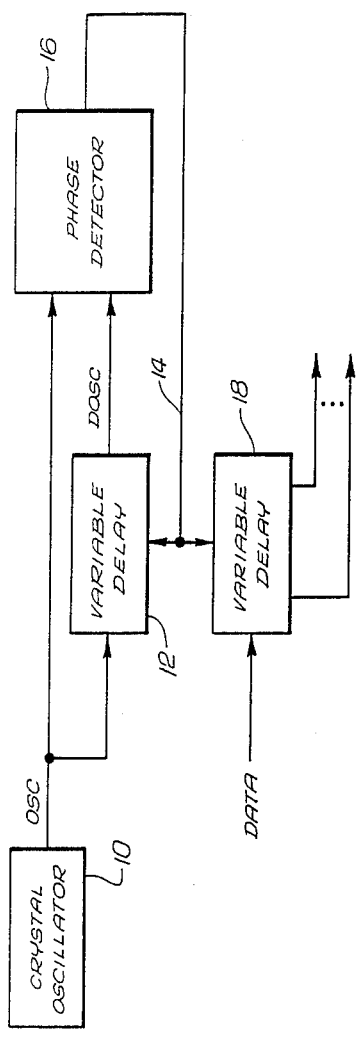
Fig. 1
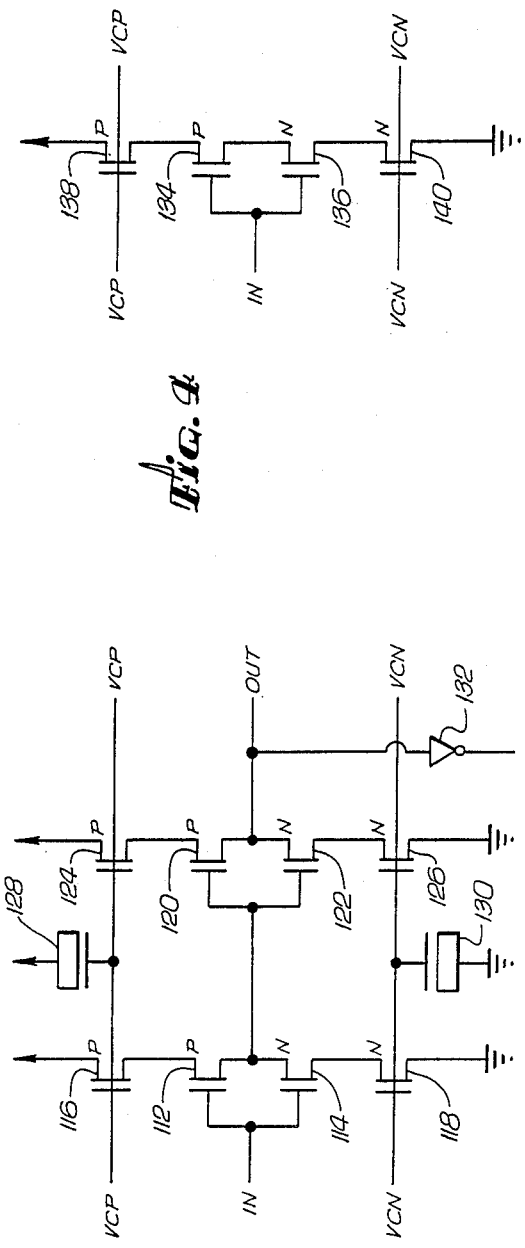
Fig. 4
Fig. 3

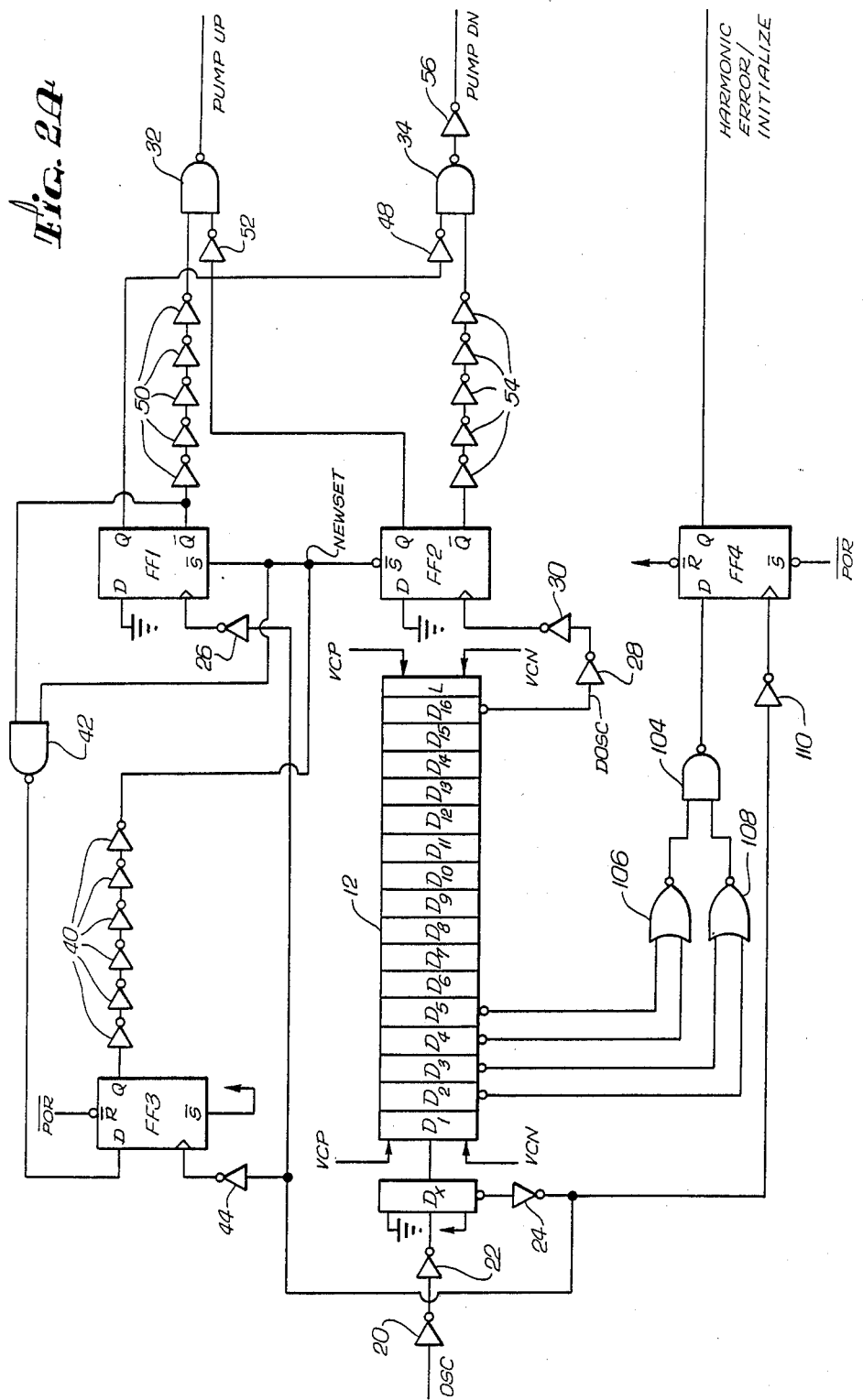

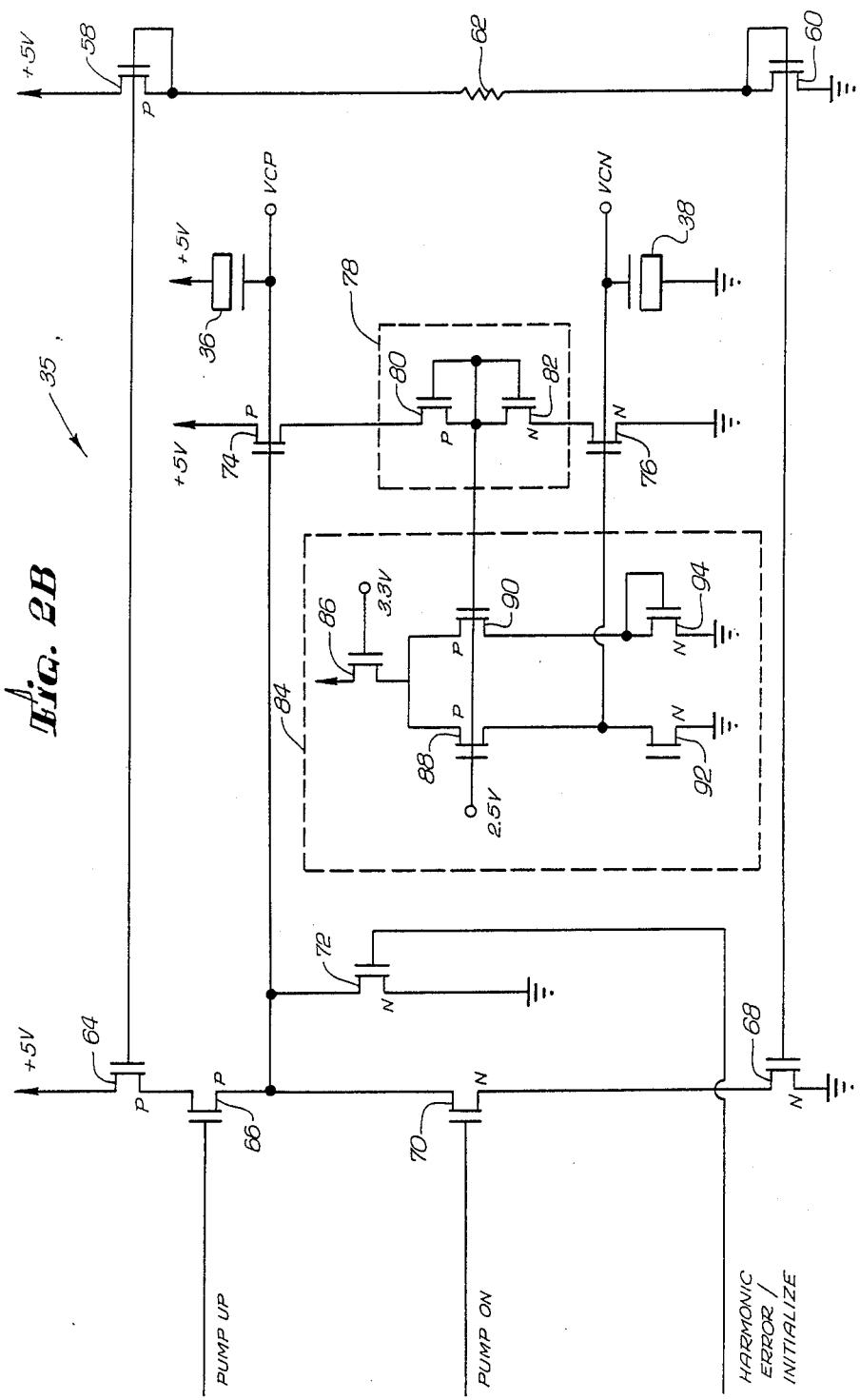

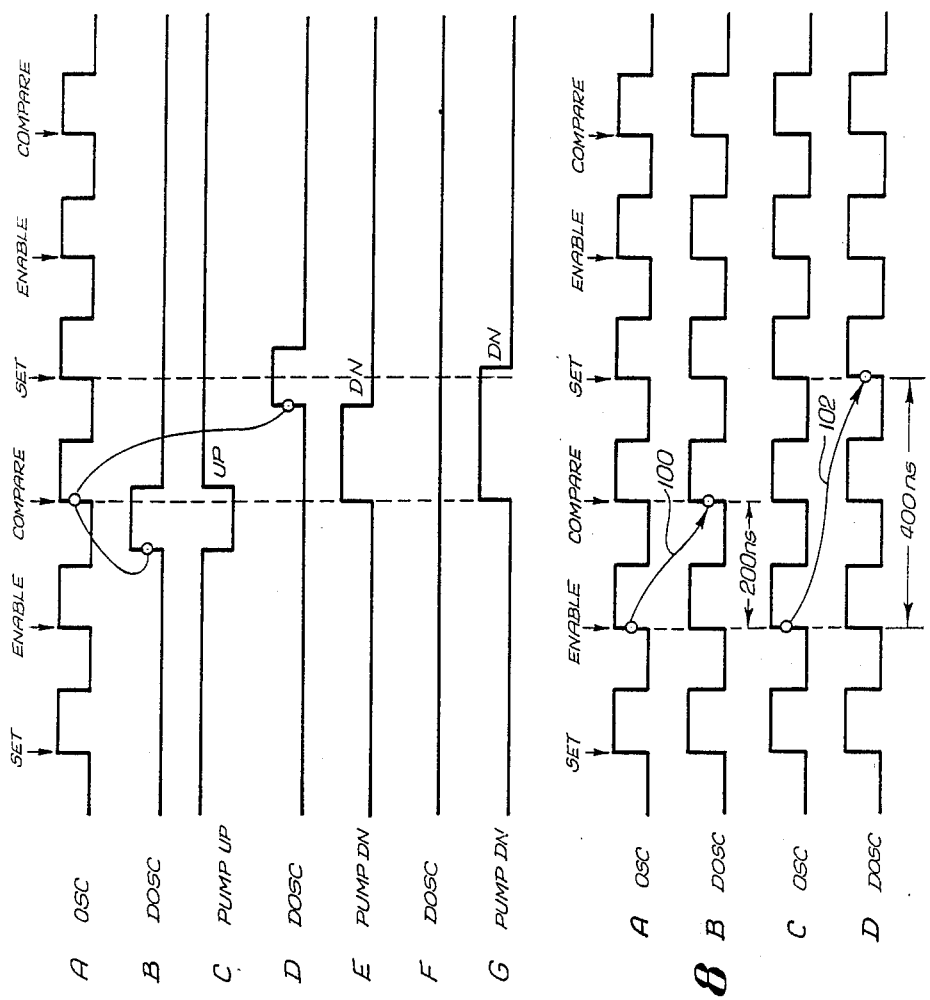

PHASE-LOCKED LOOP DELAY LINE

This is a continuation of application Ser. No. 916,404, filed on Oct. 7, 1986, now abandoned.

BACKGROUND OF THE INVENTION

1. Field of the Invention

The present invention relates to a delay circuit for providing an output signal which is delayed by a precise amount with respect to an input signal Such circuits are typically referred to as "delay lines" and have many applications For example, delay lines are commonly used in data separator phase-locked loops used in disc drive systems. Delay lines are also used to provide optimum timing for control of high speed dynamic RAM devices, which comprise the main memory of virtually all personal computers.

2. Description of the Prior Art

One type of prior art delay line is formed of a plurality of series-connected circuits such as inverters. Each inverter provides a known amount of delay, and outputs of various delays with respect to each other which are derived by tapping the outputs of different inverters along the line. Other types of delay lines include LC circuits and RC circuits. In order to achieve precise delays, parameters which affect the delay, e.g., process, temperature and voltage, must be very tightly controlled. Obtaining accurate delays in integrated circuit, delay lines has proven to be extremely difficult. The number of parameters involved, as well as the fact that the parameters change over time, renders it difficult to obtain and maintain a desired delay. Not only is it difficult to obtain precise delays, but efforts to do so through tight control of various parameters results in increased fabrication costs for the integrated circuit.

SUMMARY OF THE INVENTION

The present invention is directed to a delay line which incorporates a phase-locked loop in order to obtain and maintain precise delays. The invention takes advantage of the fact that although integrated circuit delays in and of themselves are not very accurate, the delay through identical structures (such as inverter pairs) is extremely well matched. The delay line of the present invention incorporates a plurality of matched variable delay circuits which function analogous to a voltage controlled oscillator in a phase-locked loop circuit. The output of a reference frequency source (typically a crystal oscillator of fixed frequency but possibly a variable source such as a voltage controlled oscillator) is applied to the input of the delay line. A phase detector is provided to compare the phase of the output of the delay line with the phase of the input of the delay line. An error signal is generated representative of the phase error and is applied to a control input of the delay line to vary the amount of delay and eliminate the phase error. When there is no phase error, the delay line is providing a delay equal to an integral number of periods of the reference frequency. Circuitry may be included for ensuring that the delay is equal to a single period of the reference frequency. If the reference frequency is extremely accurate (as will be the case when a crystal oscillator is used), the resulting delay provided by the delay line will also be accurate. Varying parameters such as voltage and temperature changes which may affect the delay line will thus be compensated for, since the phase-locked loop circuit will always cause the control signal to the delay line to be modified to provide the desired delay.

BRIEF DESCRIPTION OF THE DRAWINGS

The invention will be discussed with reference to the accompanying drawings, wherein:

FIG. 1 is a block diagram of the present invention;

FIGS. 2A and 2B are schematic diagrams of portions of the circuit of the present invention;

FIG. 3 is a schematic diagram of a single delay block of the delay line;

FIG. 4 is a schematic diagram of a final element of the delay line;

FIGS. 6–8 are timing diagrams associated with the operation of the delay line of the present invention.

DESCRIPTION OF THE PREFERRED EMBODIMENT

Figure 5:
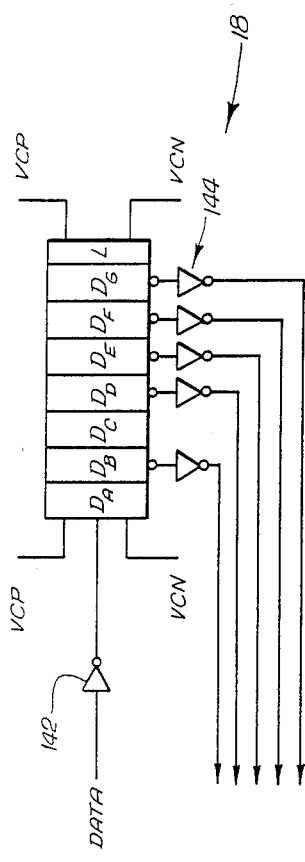
FIG. 5 is a schematic diagram of the delay line to which a data signal is applied.

Referring to FIG. 1, the present invention employs a highly accurate periodic signal from a crystal oscillator 10 to provide a delay line with precise desired delays. A variable frequency source such as a voltage controlled oscillator may be employed for certain applications. The output of the oscillator 10 is designated OSC. The output of the oscillator is applied to a variable delay line 12, which provides a delayed output signal DOSC in response to the signal OSC. The amount of delay provided by the circuit 12 is controlled by a control signal received on line 14.

The signals OSC and DOSC are both applied to a phase detector 16 which provides an error signal on the line 14 in response to the detection of a phase difference between the two signals. Thus, unless the DOSC signal is delayed with respect to the OSC signal by precisely one or more periods of the OSC signal, a phase error will exist and an error signal will be generated on the line 14. The amount of delay will be varied in response to the error signal. The phase detector 16 may also includes harmonic error detection circuitry to ensure that the delay is equal to a single period of the signal OSC rather than multiple periods.

Thus, the oscillator 10, variable delay line 12 and phase detector 16 form a phase-locked loop circuit which functions to cause the delay line 12 to provide a delay which is precisely equal to one clock period of the output of the oscillator. The control signal on line 14 which is used to control the amount of delay may then be provided to a second delay line 18 which has the same circuitry as the delay line 12 and will therefore provide identical delays. The delay line 18 provides multiple delay output taps, each having a different delay, which can be used to provide desired delays of a data signal labeled DATA. For example, when used in a data separator, the delay line 18 can be used to provide write precompensation and to generate the window signals used for data separation. For certain applications, the delay line 12 can be employed to provide plural control signals of a predetermined relationship. In such applications, the delay line 18 would not be employed.

The operation of a specific embodiment of the present invention will be described with reference to FIGS. 2A and 2B. The delay line 12 is formed of a plurality of series-connected blocks D1–D16 and an end block L. Each delay block D is formed of a CMOS inverter pair having modulated current sources to vary its switching speed. Control signals VCP and VCN are applied to each of the blocks to modulate the application of current to the CMOS inverters and vary the switching speed, thus varying the delay provided by the overall delay line.

The OSC signal from the oscillator is applied to the delay line via buffer inverters 20 and 22 and an initial delay block Dx which is provided for waveform shaping to ensure that each block of the delay line will be operating on an identically shaped signal so that the delay through each block will be identical.

The basic phase detection operation to detect a phase error between the oscillator and the output of the delay line 12 is accomplished by means of D-type flip-flops FF1 and FF2. The flip-flop FF1 is clocked by the OSC signal (applied through the inverters 20 and 22, the block Dx, an inverter 24 and an inverter 26, the delays of which are ignored in the discussion of the circuit operation). The DOSC signal clocks the flip-flop FF2 through inverters 28 and 30 (matching the delays through inverters 24 and 26). The inverters 24, 26, 28 and 30 serve as buffers to the inputs of the flip flops.

The outputs of the flip-flops FF1 and FF2 drive two NAND gates 32 and 34, the outputs of which are applied to a charge pump 35 illustrated in FIG. 2B. The charge pump generates the control signals VCP and VCN. Depending on the outputs of the NAND gates 32 and 34, MOS capacitors 36 and 38 in the charge pump will be charged or discharged to vary the values of control voltages VCP and VCN. These control voltages are applied to the delay circuit 12 to vary the amount of delay which is provided by each block. The shortest delay is provided when VCP is zero volts.

The present invention employs an additional D-type flip-flop FF3 and associated control circuitry to provide a three cycle phase comparison sequence which ensures that a correct determination will be made as to whether the delayed signal DOSC is leading or lagging the phase of the oscillator signal OSC (methods other than a three cycle sequence may also be employed). Corrections in the control signals VCP and VCN will therefore always be in the proper direction, i.e., to increase the delay when the delayed signal leads the phase of the oscillator signal and decrease the delay when the phase of the delay signal lags the phase of the oscillator signal.

Figure 6:
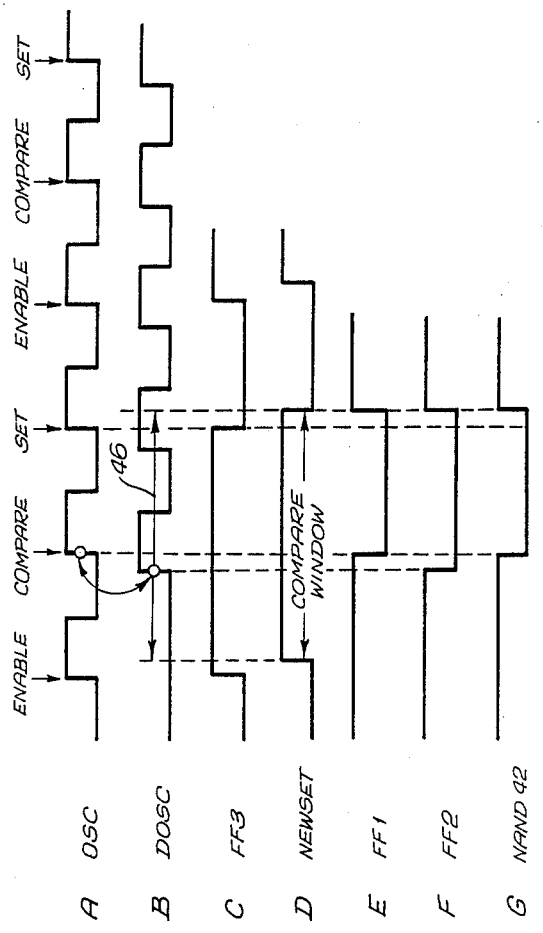

FIG. 6 is a timing diagram illustrating the three cycle phase comparison operation of the circuit of FIG. 2. The circuit is configured so that upon initial application of power, the shortest delay possible will be provided to ensure that the delayed signal will be delayed by less than one period of the OSC signal. The phase locking operation will then cause the delay to be increased until locking occurs with a delay of one period of the OSC signal. Undesirable locking on harmonics (two or more OSC periods) is thus eliminated. The provision of minimum delay upon start-up is accomplished by means of a D-type flip-flop FF4. When power is applied to the circuit a power-on reset pulse $\overline{POR}$ is applied to the set input of the flip-flop FF4, causing its Q output to go high. This signal turns on a transistor 72 (FIG. 2B), causing the capacitor 36 to discharge so that VCP is equal to zero.

The flip-flop FF3 has the power-on reset signal POR applied to its reset input. This causes its Q output to go low upon the application of power to the circuit. Six inverters 40 are connected to this output, and the output of the final inverter, labeled NEWSET, is also zero. This signal is applied to the set inputs of flip-flops FF1 and FF2 and to one input of a NAND gate 42. The $\overline{Q}$ output of the flip-flop FF1 is applied to the other input of the NAND gate 42.

The NEWSET signal functions to control the enablement of the flip-flops FF1 and FF2. Initially, NEWSET is low, causing the Q outputs of the flip-flops FF1 and FF2 to be held high. The output of the NAND gate 42 will therefore also be high. When the first rising edge of the OSC signal arrives (labeled "enable" in FIG. 6), it will clock the flip-flop FF3 (via the inverters 20 and 22, delay block Dx, inverter 24 and an inverter 44), passing the high signal at the data input to the Q output. The flip-flop FF1 will not be clocked by the first rising edge of the OSC signal, since it is not enabled due to the NEWSET signal being low.

After a slight delay caused by the inverters 40, the NEWSET signal will go high, thereby enabling both of the flip-flops FF1 and FF2. The flip-flops are thus free to be clocked by the next rising edge of the signals applied to their respective clock inputs. The flip-flop FF1 will be clocked by the OSC signal and the flip-flop FF2 will be clocked by the DOSC signal. Thus, the first OSC signal will enable the flip-flops FF1 and FF2 by means of the action of the flip-flop FF3, thereby allowing the second OSC signal (labeled "compare" in FIG. 6) to clock the flip-flop FF1 and the DOSC signal to clock the flip-flop FF2. The D inputs of both flip-flops are grounded, and the clocking will therefore cause their Q outputs to go low. In FIG. 6 the DOSC signal is illustrated as arriving before the second OSC signal, and the flip-flop FF2 will therefore be clocked first. When the flip-flop FF1 is clocked, its $\overline{Q}$ output will go high and the NAND gate 42 will go low. The next OSC signal (labeled "set" in FIG. 6) will thus cause the Q output of the flip-flop FF3 to go low which, after a short delay through the inverters 40, causes the signal NEWSET to go low. This causes the Q outputs of the flip-flops FF1 and FF2 to go high. The flip-flops will again be enabled by the next OSC pulse (also labeled "enable" in FIG. 6).

Thus, the NEWSET signal provides a window, shown in FIG. 6 as a "compare window", in which the phase comparison between the signals OSC and DOSC is enabled. The window is begun shortly after the occurrence of a fist rising edge of the OSC signal to enable the next rising edge of the OSC signal to be phase compared with the delayed signal DOSC. The window is terminated in response to the third rising edge of the OSC signal and the cycle is then repeated. The window generation ensures that the delayed signal DOSC will be compared to the next rising edge of the OSC signal rather than the rising edge corresponding to the delayed signal (e.g., in FIG. 6 the first DOSC edge is compared to the "compare" edge of the OSC signal rather than the "enable" edge which precedes it). In this manner, a correct determination of the direction of any phase error will be made.

The inverters 40 are included to provide a delay in the generation of the NEWSET signal (which is less than the minimum delay through delay element 12) in order to accommodate small amounts of jitter in the DOSC signal. The inclusion of this slight delay further minimizes the chances of incorrectly determining the direction of any phase error.

The actual phase comparison operation performed by the ciruit of FIG. 2 for different signals will be described with reference to FIG. 7. The OSC signal is shown in FIG. 7A with the three cycles of "set", "enable" and "compare" labeled. The Q output of the flip-flop FF1 is applied to the NAND gate 34 via an inverter 48, whereas the $\overline{Q}$ output of the flip-flop FF1 is applied to an input of NAND gate 32 via five inverters 50. Similarly, the Q output of the flip-flop FF2 is applied to an input of the NAND gate 32 via five inverter 52 whereas the $\overline{Q}$ output of the flip-flop FF2 is applied to an input of the NAND gate 34 via five inverters 54. The inverters 50 and 54 serve to provide a slight delay to prevent a dead zone in the operation of the charge pump.

The situation in which the delayed signal DOSC leads the phase of the oscillator signal OSC is illustrated in FIG. 7B. In this situation, the rising edge of the DOSC signal will clock the flip-flop FF2, causing the output of the NAND gate 32 to go low. This output is labeled PUMP UP in FIG. 2 and is shown in FIG. 7C. The low output of the NAND gate 32 causes the charge pump to operate to charge the capacitor 36 and increase the voltage VCP, thereby increasing the amount of delay. Concurrently, the control voltage VCN on the capacitor 38 will be reduced. The specific functioning of the charge pump will be discussed subsequently. When the "compare" OSC signal arrives, the $\overline{Q}$ output of the flip-flop FF1 will go high which, after the delay through the inverters 50, will cause the PUMP UP signal to return to a high level as illustrated in FIG. 7C.

FIG. 7D illustrates the situation in which the delayed signal lags in phase with respect to the OSC signal. In this case the charge pump is discharged to lower the VCP voltage on the capacitor 36. This results in an increase in the voltage on the capacitor 38 and thus the voltage VCN. The "compare" OSC signal will clock the flip-flop FF1, causing its Q output to go low, thus causing the output of the NAND gate 34 to go low. The output of an inverter 56, labeled PUMP DN in Figure 2 and shown in FIG. 7E, thus goes high and is applied to the charge pump. This signal causes the capacitor 36 to discharge, thus lowering VCP and raising VCN. The lowering of VCP decreases the delay of the DOSC signal, thus causing its phase to catch up with that of the OSC signal.

If for some reason the delayed signal does not occur, as illustrated in FIG. 7F, the circuit will operate to cause the PUMP DN signal to go high to lower the voltage VCP and therefore decrease the delay of the delayed signal. As illustrated in FIG. 7G, the PUMP DN signal will go high at the "compare" edge of the OSC signal and will be reset to a low level at the "set" edge (after the slight delay due to the inverters 54). A new comparison cycle will therefore begin with a shorter delay.

The present invention is designed to track changes in the delay of the delay circuit which are relatively long term and caused by factors such as temperature and supply voltage changes. The three cycle phase comparison operation which is employed to ensure that the direction of phase errors will be properly determined is sufficiently fast to correct for such long term phase errors occurring in the system.

In a conventional phase-locked loop circuit, frequency differences between the signals whose phases are compared (a reference frequency and a voltage controlled oscillator output) enable phase and frequency locking to eventually be achieved even if initial phase corrections are made in the wrong direction. In the delay circuit of the present invention, the frequencies of the signals being compared are exactly the same, since they originate from the same source. If phase corrections are made in the wrong direction, phase-locking cannot be achieved to result in the proper amount of delay. It is for this reason that a multiple cycle phase comparison sequence is employed to ensure that all phase corrections are in the proper direction.

The operation of the charge pump will be described with reference to FIG. 2B, in which the conductivity of the various MOSFET transistors is indicated by a "P" or "N". The charge pump operates to charge the capacitor 36 in response to the PUMP UP signal being low and discharge the capacitor 36 in response to the PUMP DN signal being high. If neither of these signals is present the voltage on the capacitor 36 (and thus the amount of delay) will remain essentially constant.

The charge pump includes a precision current source formed by two diode connected transistors 58 and 60 and a resistor 62. This provides a reference current for determining the charging and discharging rate of the capacitor 36. The capacitor 36 is charged by means of a transistor 64 coupled to the positive power supply. The transistor 64 is selectively coupled to the capacitor 36 by means of a transistor switch 66 which is rendered conductive when the PUMP UP signal goes low. The transistor 64 is connected to the transistor 58 in a current mirror configuration and the current through the two transistors will therefore be equal. A controlled reference current will therefore be applied to the capacitor 36 in response to the PUMP UP signal going low.

The discharging of the capacitor 36 is controlled in a similar fashion. The discharging is accomplished through a transistor 68 connected in a current mirror configuration to the transistor 60, which is coupled to the capacitor 36 by means of a transistor 70 rendered conductive when the PUMP DN signal is high. Discharging may also occur through the transistor 72 in a manner to be described subsequently.

The charging and the discharging of the capacitor 36 as described above operates to vary the control voltage VCP applied to the variable delay line so as to alter the delay provided by the circuit. In some applications, the single control voltage may be sufficient to control the delay. However, in the present embodiment of the invention, the second control voltage VCN is also generated and applied to the delay line. As will be discussed in more detail subsequently, the delay line is formed of modulated inverters in which positive and negative supply transistors are modulated to alter the switching time. The voltage VCP is applied to modulate a positive supply transistor and the voltage VCN is applied to modulate a negative supply transistor.

In order to develop VCN from VCP, the circuit of FIG. 2B operates to balance the current through transistors 74 and 76 at a point corresponding to the switching threshold of the inverters of the delay line. This is accomplished by providing an inverter 78, which is modeled after the delay inverters, formed of transistors 80 and 82 and connecting it between the transistors 74 and 76. The input of the inverter is tied to its output and compared to the switching threshold by means of a comparator 84. The switching threshold is set at 2.5 volts, i.e., one-half of the positive power supply voltage of 5 volts. The comparator is formed of transistors 86–94 and will operate to drive the gate of the transistor 76 until the input to the gate of the transistor 90 is equal to that to the gate of the transistor 88, i.e., 2.5 volts. In this manner, the currents through the transistor 74 and 76 are set to be equal at the switching threshold of the inverter 78 (and thus the inverters of the delay line). The voltage applied to the transistor 76 is also applied to charge the capacitor 38 and thus develop the control voltage VCN.

The circuit of FIG. 2 is designed to provide a delay of precisely one period of the OSC signal. In the most common application of the specific embodiment presently used, this period is 200 nanoseconds. Since the phase comparator compares rising edges of the OSC signal and the delayed DOSC signal, however, it is possible that phase-locking could occur on multiples of a single period of the signal OSC. This situation is illustrated in FIG. 8. It is desired that the delay line 12 provide a delay of one clock period as shown in FIGS. 8A and 8B. That is, it is desirable that the circuit lock on to the rising edges of the OSC and DOSC signals such that for any two signals being compared the DOSC rising edge was generated by the OSC edge one period previous to the OSC edge being compared. This is illustrated by an arrow 100. However, it is possible that the circuit will actually lock onto a rising edge of the DOSC signal which trails the OSC signal by two or more clock periods, as indicated by an arrow 102 in FIGS. 8C and 8D. In such a case, the control voltages VCP and VCN would be improperly controlled such that the modulated inverters of the delay circuit provide a delay of two or more clock periods of the OSC signal rather than one. It should be noted that even when a circuit provides improper delay, the frequency of the DOSC signal will remain equal to that of the OSC signal since the circuit operates to vary the delay of the OSC signal passing through it but not its frequency.

The present invention includes circuitry to detect improper delays of more than one clock period ("harmonic" errors) and reset the circuit so that it may again provide phase-locking with a delay of a single clock period of the OSC signal. This is accomplished by means of the flip-flop FF4 and logic circuitry including NAND gate 104 and NOR gates 106 and 108 shown in FIG. 2A. Essentially, this circuitry operates to monitor the waveform of the signal passing through the delay line 12 at a particular point in time to ensure that it corresponds to the waveform which would be achieved if the proper delay of a single period of the signal OSC is being provided. If not, the flip-flop FF4 will provide an error signal which will render the transistor 72 shown in FIG. 2B conductive and discharge the capacitor 36. This causes the control voltage VCP to go to zero, thus resetting the circuit to its shortest delay. Any subsequent phase corrections can only increase the amount of delay and the initial phase-locking will therefore achieve a single cycle delay. It should be noted that the flip-flop FF4 also renders the transistor 72 conductive when power is first applied to the circuit to start with the shortest delay as previously described. The output of the flip-flop FF4 is thus labeled HARMONIC ERROR/INITIALIZE.

The operation of the delay line 12 is such that a signal will propagate through it with a delay being added at each stage. The overall delay at the final output is equal to the sum of the delays of the various stages. At any point in time, the output of each stage will be at either a high or low level. For example, at the beginning of the OSC pulse, if the proper one cycle delay is being provided, the delay blocks D1–D8 will be at a high level and the blocks D9–D16 at a low level. In contrast, if the overall delay line is providing a two cycle delay, the blocks D1–D4 and D9–D12 will be high and the blocks D5–D8 and D13–D16 will be low. By monitoring the state of different blocks of the delay line at a particular point in time, a determination may be made as to whether the proper delay is being provided. The logic circuitry shown in FIG. 2A provides this function. The flip-flop FF4 is clocked through buffer inverters 24 and 110 by the falling edge of the OSC signal. At this point, the outputs of the delay line blocks D2–D5 should be high and their inverted outputs supplied to the gates 106 and 108 will therefore be low. The output of the NAND gate 104 will therefore also be low and the Q output of the flip-flop FF4 will be low. However, if there is a harmonic error, the block D5 will be low and its inverted output which is applied to the gate 106 will be high. This will cause the output of the NAND gate 104 to be high, thus causing the Q output of FF4 to go high. This will switch the transistor 72 in FIG. 2B and discharge the capacitor 36. The circuit will then reset to the shortest delay. The phase comparison operation will thus cause the delay to be increased until phase-locking occurs, with the delay at this point being a single cycle of the OSC signal.

FIG. 3 illustrates an individual block D of the delay line 12. Each block is comprised of a pair of CMOS inverters coupled to supply transistors which are modulated by the control signals VCP and VCN. A first inverter includes transistors 112 and 114, with the transistor 112 being coupled to a transistor 116 which is in turn coupled to the positive supply. Similarly, the transistor 114 is coupled to a transistor 118 which is connected to ground. A second inverter includes transistors 120 and 122 coupled to the positive supply and ground by transistors 124 and 126, respectively. MOS capacitors 128 and 130 are provided for local voltage stabilization. By modulating the voltages VCP and VCN, the amount of current supplied to the inverters will be varied, thus varying the switching speed of the inverters. The output of the second inverter is applied to the input of the subsequent delay block and in addition may be provided as a delay line output through a buffer inverter 132. This inverted output is the output applied to the logic circuitry for harmonic detection for the blocks D2–D5 and is the overall delayed output signal DOSC from the block D16.

As shown in FIG. 4, a final block L of the delay line is formed of a single modulated inverter including transistors 134 and 136 and modulated supply transistors 138 and 140. The purpose of this final block is to ensure that the output waveform DOSC is not affected by being the last block in the delay line.

The circuitry of FIG. 2 is provided to develop the control voltages VCP and VCN which will cause the desired delay to be achieved. However, since the OSC signal must be applied to the delay line 12 to enable development of the control voltages, the second delay line 18 is provided to achieve actual delay of a data input signal. This delay line is illustrated in FIG. 5 as including seven delay blocks $D_A$–$D_G$ which are identical to the blocks in the delay line 12. The control voltages VCP and VCN will therefore provide the blocks DA–DG with the same delay as the blocks D1–D16. This amount of delay is, of course, locked on to a desired value by the operation of the phase-locked loop circuit. In the situation where a 200 nanosecond delay is provided by the delay line 12, each block of the delay lines 12 and 18 will provide a delay of 12.5 nanoseconds. A data signal is applied to the delay line 18 via a buffer inverter 142, and the outputs of various blocks of the line 18 may be employed to provide signals of different desired delays. For example, in order to generate a window signal for data separation, the output of the blocks $D_B$ and $D_G$ may be used to provide two signals having a precise delay with respect to each other. In this instance, since the two blocks are five blocks apart, the overall delay would be 62.5 nanoseconds. Similarly, other outputs may be employed to provide different amounts of delay for write precompensation purposes. Inverters 144 are provided to obtain signals having proper polarity for application to subsequent logic circuitry. It should be noted that the data signal which is applied as the input to the delay line 18 is not used as the non-delayed signal for application to further circuitry. Rather, two of the delayed signals are employed because of the precise known delay between blocks.

In summary, the present invention provides a phase-locked loop delay circuit which achieves precise delays despite changes in operating parameters such as temperature and power supply, and wide variations in processing during circuit manufacture. The system incorporates a variable delay line in a phase-locked loop circuit, with the phase-locking operation being used to generate a control voltage to control the amount of delay provided by the delay line. A separate delay line incorporating identical delay blocks is controlled by the same control voltage and is used to delay a data signal. The invention is especially useful in systems in which a crystal oscillator or other reference timing signal source is already provided in the circuit.

We claim:

1. A circuit for providing a signal having a precise delay with respect to a digital input signal, comprising:
   a single reference frequency source for generating a periodic input signal of constant period;
   a variable delay circuit for receiving the input signal and generating an output signal which is delayed with respect to the input signal, herein the delay circuit includes a control voltage input to control the amount of delay;
   control means for comparing the phase between the input signal and the output signal and varying the amount of delay provided by the delay circuit to achieve and maintain a desired delay equal to an integer multiple of said constant period, wherein the control means includes:
   means for generating the control voltage as a function of the phase difference between the input signal and output signal, and
   means, coupled to the means for generating, for determining whether the phase of the input signal leads or lags the phase of the output signal,
   wherein the means for generating the control voltage includes a charge pump having a capacitor which is charged or discharged, wherein the voltage across the capacitor is the control voltage, and
   wherein the means for determining generates a first signal causing the charge pump to charge the capacitor in a first direction when the phase of the input signal leads the phase of the output signal and generates a second signal causing the charge pump to charge the capacitor in the opposite direction when the phase of the input signal lags the phase of the output signal.

2. A circuit as in claim 1 wherein the means for determining includes a phase detector which receives the input signal and output signal and generates the first signal during a time period between a rising edge of the input signal and the next rising edge of the output signal and generates the second signal during a time period between a rising edge of the output signal and the next rising edge of the input signal.

3. A circuit as in claim 2 wherein the phase detector includes a first D-type flip-flop which is set by a rising edge of the input signal and a second D-type flip-flop which is set by a rising edge of the output signal, a first logic gate operatively coupled to receive an output from each flip-flop and provide said first signal and a second logic gate operatively coupled to receive an output from each flip-flop and provide said second signal.

4. A circuit as in claim 1 wherein the delay circuit includes a plurality of delay stages, each delay stage generating a delay stage output signal and wherein said control means includes harmonic control means coupled to said delay stages so as to receive said delay stage output signals for causing the delay stage output to be delayed with respect to the input signal by a predetermined number of periods of the input signal.

5. A circuit as in claim 4 wherein the predetermined number of period is one and wherein the harmonic control means includes means for monitoring the output signal to determine whether it has a desired timing relationship to the input signal and means coupled to the means for monitoring, for correcting the value of the control voltage to achieve a delay of one period if an improper timing relationship is detected.

6. A circuit as in claim 5 wherein the means for correcting comprises means for resetting the control voltage to a value such that the delay circuit provides an output signal having a minimum delay, whereby the circuit will thereafter operate to increase the delay of the output signal to achieve a delay of one period of the input signal.

7. A circuit as in claim 1 wherein the delay circuit includes a plurality of series connected inverters and means for modulating the switching speed of the inverters.

8. A circuit as in claim 7 wherein each inverter is comprised of a CMOS transistor pair and wherein the means for modulating comprises additional transistors coupled between the inverters and power supply connectors, wherein the control voltage is applied to the additional transistors to modulate the current supplied to the inverters and thereby modulate their switching speed.

9. A phase-locked circuit for providing an output signal having precise delay with respect to a single periodic digital input signal, comprising:
   means for providing a single periodic digital input signal of a reference frequency and having a constant period;
   variable delay means for receiving the input signal and generating an output signal which is delayed with respect to the input signal by an integer multiple of said constant period;
   phase-locked control means for receiving the input signal and the output signal and controlling the variable delay means so that the output signal is locked in phase with respect to the input signal and maintained at a delay of an integer multiple of said constant period, wherein the phase-lock control means includes a phase comparator for comparing the phase of the input signal with the phase of the output signal and generating a first error signal when the phase of the input signal leads the phase of the output signal and a second error signal when the phase of the input signal lags the phase of the output signal; and correction means coupled to the phase-lock control means and the variable delay means, for generating a control signal in response to the error signals to control the amount of delay of the delay means, wherein the correction means includes a charge pump having a first capacitor which is charged in a first direction in response to the first error signal and in a second direction in response to the second error signal, wherein the voltage across the capacitor is the control signal for controlling the delay means.

10. The circuit of claim 9 wherein the control means includes means for causing the output signal to be delayed by a predetermined number of periods of the input signal.

11. The circuit of claim 9 wherein the delay means includes a plurality of series connected inverters and means for varying the switching speed of the inverters thereby to vary the delay of the delay means.

12. The circuit of claim 11 further comprising a first power supply connection for receiving externally provided current and wherein each inverter is comprised of a pair of CMOS transistors and wherein the means for varying includes a plurality of first supply transistors coupled between the first power supply connection and the inverters for controlling the application of current to the inverters, wherein the supply transistors are driven by the control signal from the capacitor.

13. The circuit of claim 12 wherein:
the means for varying includes a plurality of second supply transistors coupled between a second power supply connection and the inverters for controlling the application of current to the inverters; and
the correction means includes means, coupled to the second supply transistors, for generating a second control signal to drive the second supply transistors.

14. The circuit of claim 13 wherein the first supply transistors are MOS transistors of first conductivity type and the second supply transistors are MOS transistors of second conductivity type and wherein the means for generating the second control signal controls the value of the second control signal as a function of the value of the first control signal.

15. The circuit of claim 14 wherein the means for generating the second control signal includes:
a current source;
a first control MOS transistor driven by the control signal;
a second control MOS transistor coupled to the current source so as to allow current flow therethrough;
a second capacitor connected to the gate of the second control MOS transistor, wherein the voltage on the second capacitor is the second control signal; and
current control means, coupled to the second control MOS transistor and the first control MOS transistor for driving the second control MOS transistor so that the current through it has a predetermined relationship to the current through the first control MOS transistor.

16. The circuit of claim 15 wherein the current control means includes:
a CMOS inverter having its input connected to its output, wherein the first and second control MOS transistors are connected to supply current to the inverter; and
comparison means, coupled to the output of the CMOS inverter and the gate of the second control MOS transistor, for comparing the output of the inverter to a reference voltage and driving the second control MOS transistor unit the output of the inverter is equal to the reference voltage.

17. The circuit of claim 16 wherein the reference voltage is approximately equal to the switching voltage of the inverter.

18. A circuit for providing a controlled amount of delay to a digital input signal, comprising:
reference frequency means for providing a periodic output signal having a constant period;
a first variable delay circuit for receiving the output of the reference frequency means and providing an output signal having a delay determined by a control signal;
phase lock means for comparing the phase of the output signal of the reference frequency means with the phase of the output signal of the first variable delay circuit and generating the control signal to the first variable delay circuit which causes the output signal of the first variable delay circuit to lock onto the phase of the output of the reference frequency means and be maintained at a delay of an integer multiple of said constant period; and
a second variable delay circuit for receiving a digital input signal and providing an output signal which is delayed with respect to the input signal and maintained at a delay of an integer multiple of said constant period, wherein the control signal is applied to the second variable delay circuit to control the amount of delay and wherein the variation in delay of the first variable delay circuit in response to a change in the control signal is proportional to the change in the amount of delay of the second variable delay circuit in response to the same change in the control signal.

19. A phase-locked loop circuit for provided a signal which is precisely delayed with respect to a single period reference signal of constant period, comprising:
a single reference frequency source for providing the single periodic reference signal of constant period;
a variable delay circuit having a first input for receiving the reference signal and a control input for receiving a control signal, the variable delay circuit providing a periodic output signal which has the same frequency as the reference signal and is delayed with respect to the reference signal by an amount, determined by the control signal, equal to an integer multiple of said constant period;
control means for comparing the phase between the reference signal and the output signal and providing the control signal to the variable delay circuit to vary the amount of delay to achieve a desired phase relationship and maintain said delay at an integer multiple of said constant period, wherein the control means includes;
means, coupled to the control means, for setting the control signal to an initial value which will result in a delay that causes the initial phase error to be in a known direction, a phase detector for comparing the phases of the reference signal and the output signal and generating a first error signal when a phase error of a first direction is detected and a second error signal when a phase error of a second direction is detected, and a charge pump, coupled to the means for setting, for receiving the error signals and generating the control signal in response to the error signals.

20. A circuit as in claim, 19 wherein the phase detector includes:
  a first D-type flip-flop clocked by a rising edge of the reference signal;
  a second D-type flip-flop clocked by a rising edge of the output signal;
  phase comparison control means for enabling the flip-flops in response to a first rising edge of the reference signal whereby the first flip-flop may be clocked by the next rising edge of the reference signal and the second flip-flop may be clocked by the next rising edge of the output signal; and
  logic means connected to the outputs of the flip-flops for generating the error signals.

21. A phase-locked loop circuit for providing a signal which is precisely delayed with respect to a periodic reference signal having a constant period, comprising:
  a reference frequency source for providing the periodic reference signal of constant period;
  a variable delay circuit having a first input for receiving the reference signal and a control input for receiving a control signal, the delay circuit providing a periodic output signal which has the same frequency as the reference signal and is delayed with respect to the reference signal by an amount determined by the control signal equal to an integer multiple of said constant period;
  control means, coupled to the reference frequency source and the variable delay circuit, for comparing the phase between the reference signal and the output signal and providing the control signal to the delay circuit to vary the amount of delay to achieve a desired phase relationship and maintain said delay at an integer multiple of said constant period, the control means including means for determining the direction of phase error between the reference signal and output signal and varying the control signal in a direction which will reduce the phase error, wherein the means for determining includes:
  a phase detector for comparing the phase of the reference signal and the output signal and generating a first error signal when a phase error of a first direction is detected and a second error signal when a phase error of a second direction is detected; and
  a charge pump for receiving the error signals and generating the control signal in response to the error signals, wherein the phase detector includes:
  a first D-type flip-flop clocked by a rising edge of the reference signal;
  a second D-type flip-flop clocked by a rising edge of the output signal;
  phase comparison control means for enabling the flip-flops in response to a first rising edge of the reference signal whereby the first flip-flop may be clocked by the next rising edge of the reference signal and the second flip-flop may be clocked by the next rising edge of the output signal; and
  logic means connected to the outputs of the flip-flops for generating the error signals, wherein the phase comparison control means includes a third D-type flip-flop clocked by a rising edge of the reference signal, wherein the output of the third flip-flop controls the enabling of the first and second flip-flops.

22. A circuit as in claim 21 wherein the third flip-flop is configured to provide an output which (a) enables the first and second flip-flops in response to a first rising edge of the reference signal to permit the first flip-flop to be clocked by the next rising edge of the reference signal and (b) resets the first and second flip-flops to a non-enabled condition in response to a third rising edge of the reference signal occurring immediately after said next rising edge of the reference signal.

23. A phase-locked circuit for providing an output signal having precise delay with respect to a period digital input reference signal, comprising:
  means for providing a periodic digital input reference signal of a constant reference frequency and period;
  first variable delay means for receiving the input reference signal and generating an output reference signal which is delayed with respect to the input reference signal;
  phase-lock control means for receiving the input reference signal and the output reference signal and controlling the delay means so that the output signal is locked in phase with respect to the input reference signal and maintained at a delay of an integer multiple of said constant period; and
  second variable delay means for receiving an input data signal and generating an output data signal which is delayed with respect to the input data signal, the amount of delay of the second variable delay means being controlled by the phase-lock control means, wherein the change in the delay of the first variable delay means results in a proportional change in the amount of delay of the second variable delay means.

24. A digital delay circuit for delaying one or more digital signals by a precise time delay, comprising:
  a reference node for receiving a single periodic reference signal;
  master delay means, coupled to the reference node, for receiving the reference signal and delaying the reference signal by an adjustable first time delay having a magnitude and outputting a first delayed signal having a frequency identical to the reference signal and a phase which is delayed relative to the reference signal by said first time delay;
  delay detecting means, coupled to the reference node and the master delay means, for detecting the phase relationship between the reference signal and the first delayed signal and for outputting a phase difference signal indicative of the magnitude of the first time delay;
  delay control means, coupled to the delay detecting means and the master delay means, for supplying a delay control signal to the master delay means in response to the phase difference signal so as to cause the first time delay indicated by the phase difference signal to converge on a predetermined value and be maintained at said value; and
  slave delay means, coupled to the delay control means and having delay characteristics substantially identical to those of the master delay means, for receiving a supplied digital input signal and outputting a second delayed signal having a frequency which is identical to the digital input signal and a phase which is delayed relative to the digital input signal by a second time delay determined in accordance with the delay control signal supplied by the delay control means.

25. A digital delay circuit according to claim 24 wherein the master delay means comprises a plurality of digital delay stages of substantially identical delays, each of the delay stages being controlled by the delay control signal of the delay control means, a first one of the delay stages outputting the first delayed signal and a second one of the delay stages outputting a second delayed signal having a frequency identical to the reference signal and a phase which is delayed relative to the reference signal by a second time delay.

26. A digital delay circuit according to claim 24 wherein the master delay means comprises a plurality of digital delay stages of substantially identical delays, wherein each of the delay stages is controlled by the delay control signal of the delay control means, each of the delay stages comprises a digital logic circuit having a switching speed and a power input for supplying electrical power to the digital logic thereof and each of the delay stages further comprises a current controller, coupled to the digital logic circuit and response to the delay control signal, for controlling the amount of current supplied to the digital logic circuit of the delay stage through its power input and changing the switching speed of the digital logic circuit in response to the delay control signal.

27. A digital delay circuit according to claim 26 wherein the digital logic circuit of each delay stage comprises first and second MOSFET's and the current controller comprises a third MOSFET connected in series with the first and second MOSFET's.

28. A digital delay circuit according to claim 24 wherein the master and slave delay means are formed on an integrated circuit and include two or more delay stages that are substantially identical.

29. A digital delay circuit according to claim 24 further comprising a single reference signal generator, coupled to the reference node, for supplying the single period reference signal to the reference node.

30. A digital delay circuit according to claim 29 wherein the single reference signal generator includes a crystal oscillator.

31. A digital delay circuit according to claim 24 wherein:

the master delay means includes an input and a first output and a plurality of delay stages each having a tapped delay output for producing samples of the logic state of the reference signal at each of the delay stages; and the digital delay circuit further comprises harmonic detection means, coupled to the tapped delay outputs, for detecting whether the logic stage of the reference signal at the plurality of delay stages at a particular point in time corresponds to a single cycle of the periodic reference signal being spatially distributed over the master delay means from its input to its first output or whether the waveform corresponds to more than one such cycle.

* * * * *

UNITED STATES PATENT AND TRADEMARK OFFICE
CERTIFICATE OF CORRECTION

PATENT NO. : 4,922,141

DATED : May 1, 1990

INVENTOR(S) : KARL M. J. LOFGREN, et al.

It is certified that error appears in the above-identified patent and that said Letters Patent is hereby corrected as shown below:

In claim 1, at column 9, line 39, change "herein" to --wherein--.

In claim 5, at column 10, line 25, change "period" to --periods--.

In claim 8, at column 10, lines 46-47, change "connectors" to --connections--.

In claim 16, at column 12, line 11, change "unit" to --until--.

In claim 19, at column 12, line 45, change "provided" to --providing--.

In claim 29, at column 16, line 11, change "period" to --periodic--.

Signed and Sealed this

Sixteenth Day of July, 1991

Attest:

HARRY F. MANBECK, JR.

*Attesting Officer*      *Commissioner of Patents and Trademarks*